United States Patent [19]

Ohta

[11] Patent Number: 4,526,132
[45] Date of Patent: Jul. 2, 1985

[54] EVAPORATOR

[75] Inventor: Tatsuo Ohta, Sagamihara, Japan

[73] Assignee: Konishiroku Photo Industry Co., Ltd., Japan

[21] Appl. No.: 554,242

[22] Filed: Nov. 22, 1983

[30] Foreign Application Priority Data

Nov. 24, 1982 [JP] Japan ................................. 57-205886
Dec. 29, 1982 [JP] Japan ................................. 57-230998

[51] Int. Cl.³ ............................................. C23C 13/12
[52] U.S. Cl. ......................................... 118/719; 118/723; 118/726; 118/733; 427/38; 204/192 N
[58] Field of Search ................... 118/726, 723, 50.1, 118/719, 733; 427/39, 40, 41, 42, 38, 255.2; 204/192 N

[56] References Cited

U.S. PATENT DOCUMENTS

| 3,847,114 | 11/1974 | Kiyozumi | 118/726 |
| 3,980,044 | 9/1976 | Zollinger | 118/723 |
| 4,239,584 | 12/1980 | Chang et al. | 156/612 |
| 4,392,452 | 7/1983 | Taketoshi et al. | 118/726 X |
| 4,439,463 | 3/1984 | Miller | 427/39 |

FOREIGN PATENT DOCUMENTS 29747 6/1981 European Pat. Off. ............ 118/728

Primary Examiner—John D. Smith
Assistant Examiner—Bernard F. Plantz
Attorney, Agent, or Firm—Finnegan, Henderson, Farabow, Garrett & Dunner

[57] ABSTRACT

An apparatus for performing deposition on a substrate wherein the discharger is disposed in an outwardly protruding portion of the vacuum chamber. The discharger is positioned in this outwardly protruding portion so that it is isolated from the evaporation space and directed away from both the substrate and evaporation space. The discharger comprises a gas introduction tube with a discharge electrode surrounding this tube.

24 Claims, 13 Drawing Figures

--- SHEET RESISTANCE
— TRANSMISSION FACTOR (5000Å)

a: WITHOUT HEAT TREATMENT
b: HEAT TREATMENT (300°C, ONE HOUR, IN THE AIR)

EVAPORATOR

BACKGROUND OF THE INVENTION

1. Field of the Invention

This invention relates to an evaporator into which a reactive gas is introduced to perform a vacuum deposition, and particularly to a reaction deposition evaporator.

2. State of the Art

This type of evaporator can be used to, for example, prepare a transparent conductive film consisting of indium tin oxide (i.e., ITO), where at least one of an In—Sn alloy and the oxides thereof is evaporated and deposited on a substrate in the presence of an ionized or activated oxygen gas.

Examples of this type of evaporators are a D.C. ion-plating apparatus and an RF ion-plating apparatus. Examples of the RF ion-plating utilizing high-frequency discharge have been described in Japanese Patent Publication Open to Public Inspection (hereinafter referred to as Japanese Patent O.P.I. Publication) Nos. 84474/1975, 113733/1974, and 120877/1974.

As shown in FIG. 1, for example, substrate 2 is heated in a vacuum chamber (bell-jar) 30 by heater 34 and a prescribed voltage 35 from $-10$ V to $-10$ kV is applied, if necessary, to an electrode behind substrate 2. A.C. voltage 71 is applied to coil electrode 70 which is a high frequency discharge electrode arranged over a vapor source 25. The A.C. frequency may be freely selected, however, a discharge is stabilised when using a high frequency such as 13.56 MHz. A glow discharge generated thereby between substrate 2 and electrode 70 activates or ionizes vapor of an evaporated material and each atom of unactivated reactive gas introduced from gas introduction tube 36 so that an ITO layer may be accumulated on substrate 2.

It was, however, found that the described well-known apparatuses have unacceptable disadvantages as mentioned in the following items (1) and (2):

(1) A high frequency discharge is stably performed in such a low vacuum state as the order of $10^{-3}$–$10^{-4}$ Torr. However, in a high vacuum state such as $10^{-5}$–$10^{-4}$ Torr, the discharge will be unstable, so that it will become difficult to perform a reaction deposition.

Accordingly, to increase the adhesion of a deposited layer to a substrate, and to form the deposited layer with a close-packed structure, it is necessary to apply an electric field for accelerating evaporated material by applying a high voltage to the substrate. It is, however, difficult to provide a voltage application means when a deposition layer is formed on an insulating substrate such as a glass or plastic substitute.

(2) Because of a large amount of evaporated materials become deposited on a high frequency discharge electrode, the deposited evaporated materials are peeled off after being bombarded by discharge during a long period of operation. Thereby, the discharge becomes unstable or the evaporated materials get mixed in a vapor source so that the deposited layer becomes uneven. Further, the evaporated materials deposit on a high frequency lead-in terminal to cause a leak.

A conventional discharger 37 shown in FIG. 6 comprises an electrode 62', which is one end of a cylinder having gas inlet 61', and a discharge space 63' having a member 64', comprising an annular glass structure for example, joined at one end thereof with electrode 62' so as to enclose discharge space 63'. Another ring-shaped electrode 66' has an outlet 65' at the other end of the above-mentioned charge space enclosing member 64'. A D.C. or A.C. voltage is applied between electrode 62' and electrode 66', and a glow discharge thereby occurs in discharge space 63' with hydrogen gas, for example, supplied through gas inlet 61'. Active hydrogen comprising hydrogen atoms or molecules electronically energized by the glow-discharge and hydrogen ions ionized thereby are exhausted from outlet 65'. The exemplified discharge space enclosing member 64' is of a double tube, i.e., annular, structure that permits cooling water to flow therethrough. The numerals 67', 68', respectively, designate the cooling water inlet and outlet. The numeral 69' designates the cooling fin for electrode 62'.

In the hydrogen gas discharge tube of FIG. 6, the distance between the electrodes is 10 cm to 15 cm, and a voltage of 600 V is applied. The pressure in discharge space 63' is on the order of $10^{-2}$ Torr. In this discharger, however, electrodes 62', 66' and the sealing member (not shown) provided in the electrode fitting position are connected to discharge region 63'. Therefore, they are bombarded by gas ions produced when discharging, and contaminations, sealing deterioration and the like are produced, so that the discharger is impractical to use.

SUMMARY OF THE INVENTION

The problems as mentioned above are resolved by an evaporator into which a reactive gas is introduced to operate a vacuum deposition having a discharger inside the evaporator, wherein the discharger comprises a gas introduction tube and a discharge electrode surrounding the gas introduction tube.

The evaporator of the invention is better than well-known evaporators and exhibits the characteristic features mentioned in the following points (1) to (3).

(1) It is possible to provide a gaseous discharge device with a gas introduction tube for introducing reactive gas from a gas inlet and to generate discharges in the gas introduction tube by means of discharge electrodes surrounding the gas introduction tube. It is, therefore, possible to maintain a local gas pressure in a discharge region higher than that in the space of an evaporation chamber. Accordingly, a high frequency discharge can stably be performed and it is possible to reduce the gas pressure in the space of the evaporation chamber so that no electric field for acceleration is required, and an excellent quality deposited layer may be casted.

(2) Because of the discharge electrodes surround the gas introduction tube, it is possible to effectively ionize or activate the gas in the introduction tube where the gas pressure is relatively high, and to feed the gas into the chamber without making the gas pressure therein higher. Accordingly, it is possible to incorporate the ionized or activated gas into a deposited layer efficiently.

(3) Because a discharge occurs in the gas introduction tube and the discharge electrodes and the high frequency lead-in terminal are separated from the discharge region, no bombardment by gas ions occurs, and it is therefore possible to prevent over-heating of an electrode material, vaporization caused by bombardment, and contamination in the deposition space.

DETAILED DESCRIPTION OF THE INVENTION

The invention will become more apparent in the detailed description and examples which follow.

Figure 1:
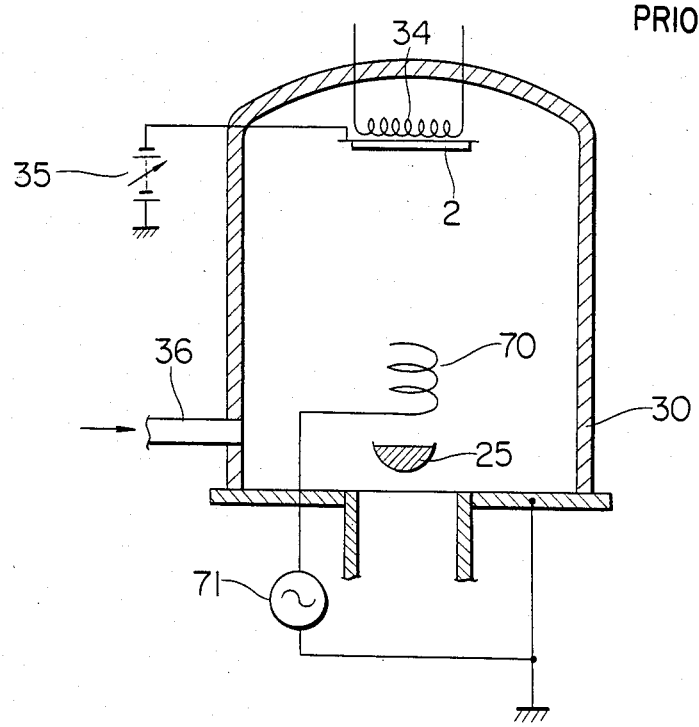
FIG. 1 is a schematic sectional view of a conventional RF ion-plating apparatus.
Figure 2:
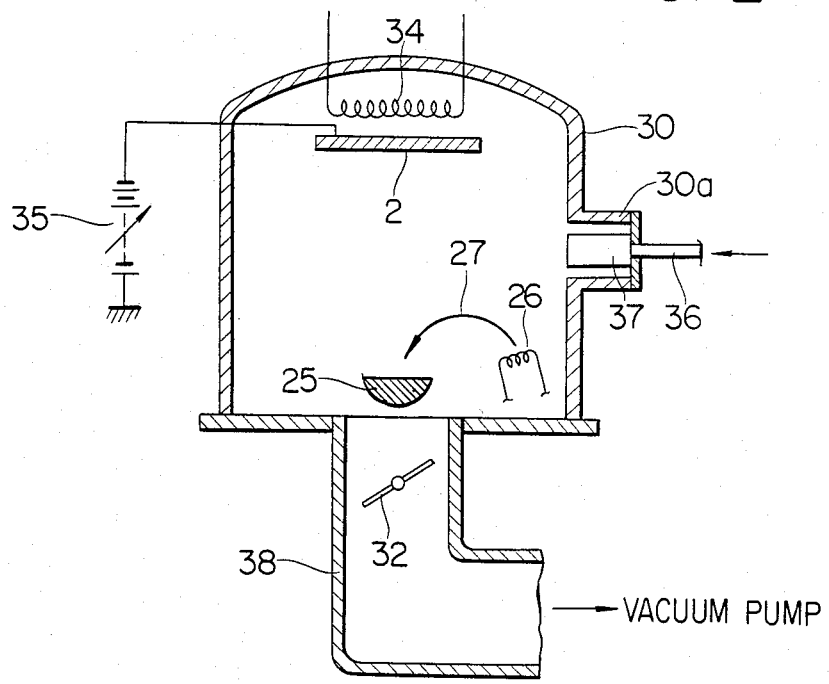
FIG. 2 is an schematic sectional view of a evaporator.

FIG. 2 shows an example of the present invention. A vacuum pump (not shown) is connected to bell-jar 30 through air exhaust path 38 having butterfly valve 32; and the inside of the bell-jar 30 is settled at a high vacuum of $10^{-5}$–$10^{-7}$ Torr, for example by the pump. Substrate 2 is mounted inside of the bell-jar 30 and is heated by heater 34 to not higher than 600° C. and preferably to not higher than 300° C. Reactive gas at a gas pressure in the range of $1 \times 10^{-6}$ to $8 \times 10^{-4}$ Torr is activated or ionized by a discharge tube 37 (to be described in detail later) which is connected to gas inlet 36. As the ionized gas is introduced into the bell-jar, an evaporating material is heated to vaporize from a vapor source 25 which is arranged so as to face substrate 2. An electron beam 27 generated by electron gun heater unit 26 or a resistance heating system may be used to heat the evaporating material. A negative bias voltage may be applied to substrate 2 [actually, an electrode (not shown) behind the substrate], if required, by a variable direct current power supply 35.

Figure 3:
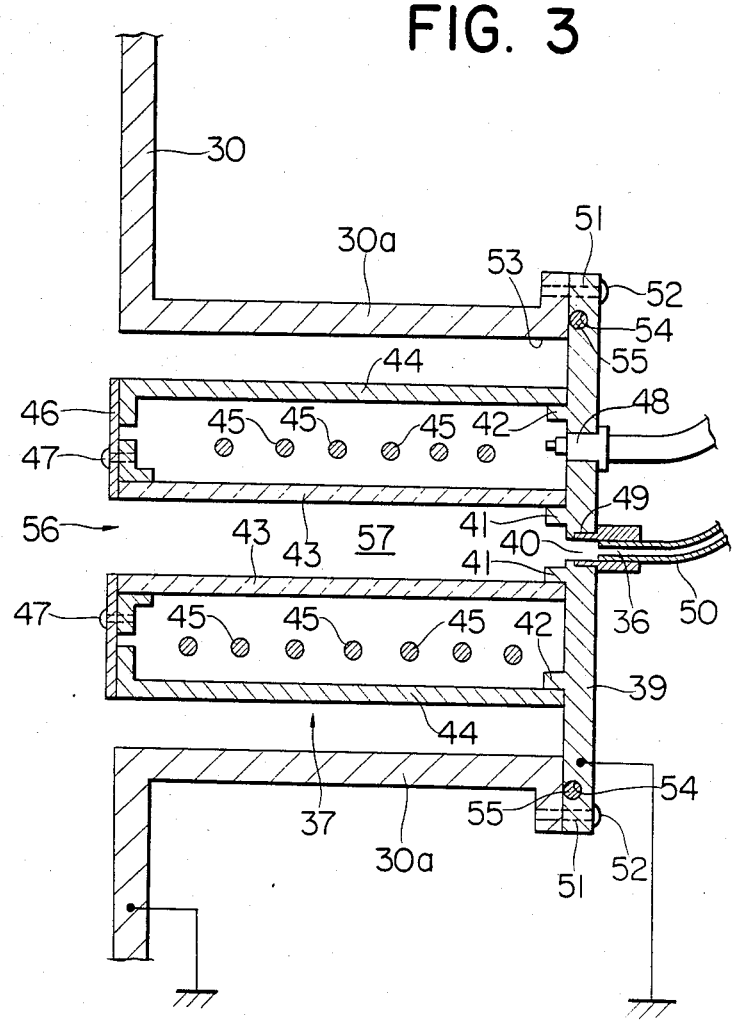
FIG. 3 is an expanded sectional view of a discharger.
Figure 4:
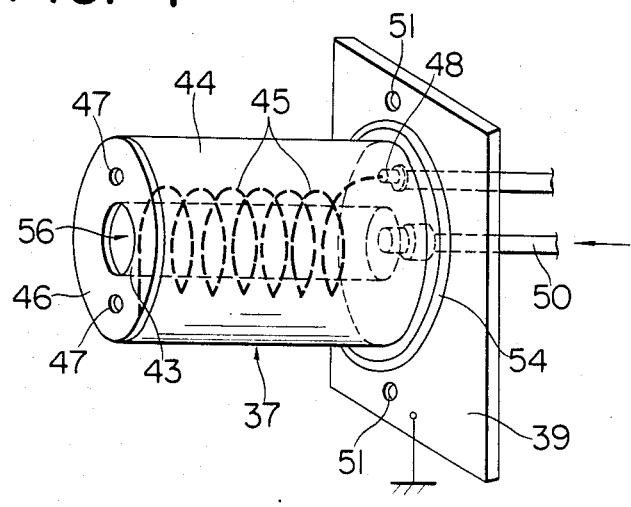
FIG. 4 is a perspective view of the discharger.
Figure 5:
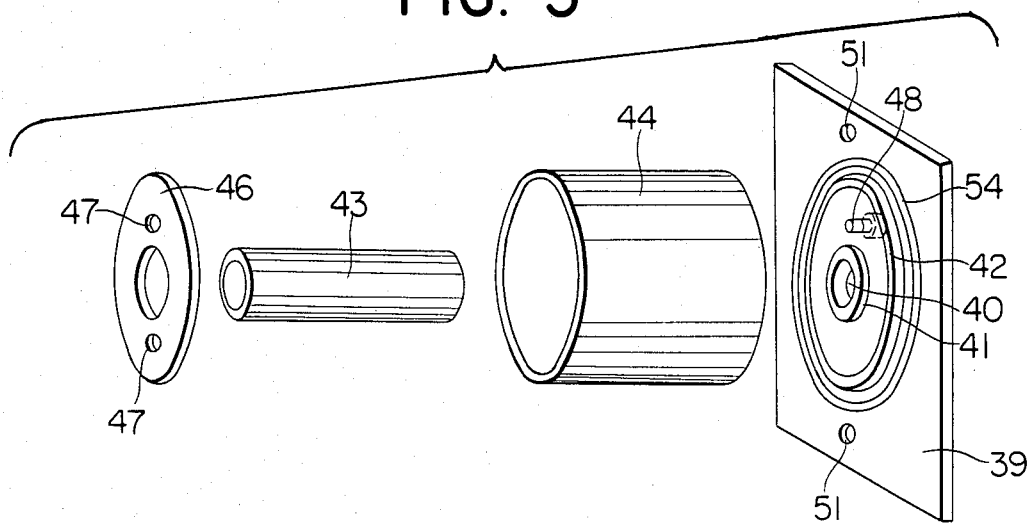
FIG. 5 is an exploded perspective view of the discharger (in which a high frequency discharge electrode is not shown)
Figure 6:
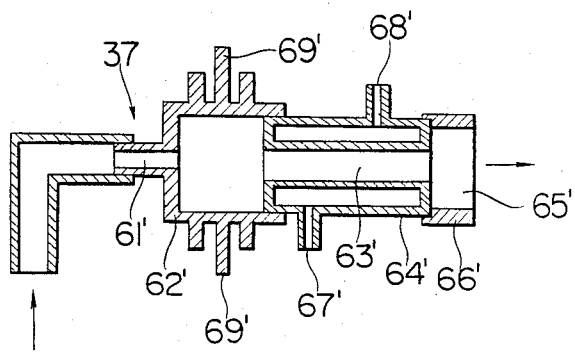
FIG. 6 is a sectional view of another discharger having different structure.

Discharge tube 37 is designed as shown in FIGS. 3 to 5.

To be more concrete, discharger 37 is mounted on a flange 39 which is detachably attached to an outward protrusion tube 30a of bell-jar 30. The central portion of flange 39 is perforated (i.e, inlet 40) so as to connect to the gas inlet 36. Smaller diametric ring-shaped protrusion 41 and larger diametric ring-shaped protrusion 42 are concentrically provided to the circumference of the inlet 40. Gas introduction tube 43 is detachably engaged to fit to protrusion 41, while cylindrical protective member 44 is similarly fitted to protrusion 42. On the outer peripheral surface of introduction tube 43, coil-shaped discharge electrodes 45, for example, are wound round. Ring plate 46 is fixed by screws 47 to the inner end surfaces of introduction tube 43 and protective member 44, and both of introduction tube 43 and protective member 44 are fitted to flange 39 in such a state where discharge electrodes 45 are accommodated therebetween. Besides the above, various arrangements thereof, may be considered. For example, ring plate 46 is fixed in advance and then the protrusions 41, 42 may be fitted in at the same time.

High frequency lead-in terminal 48 connected with one end of electrode 45 is engaged to fit in advance to flange 39. Gas introduction tube 50 from the exterior is fixedly screwed onto the central portion of flange 39 through screw threads 49. Flange 39 is fixed to protrusion tube 30a of bell-jar 30 by screwing bolt 52 into screw hole 51, so that opening 53 of protrusion tube 30a can be sealed. At this time, a sealing member such as rubber-made O-ring 55 is fitted in a ring-shaped groove which is formed on the inner surface of flange 39, and thus, protrusion tube 30a and flange 39 are fixedly joined to be airtight.

As mentioned above, discharger 37 of this example is detachably fitted to the inner portion of bell-jar 30 through flange 39. In addition, the discharger 37 is constructed to be an L-coupling type (i.e., an inductance coupling type) to which coil electrode 45 is provided. In this type of discharger 37, the ionized or activated components of reactive gas generated inside gas introduction tube 43 by a high frequency voltage are led out from releasing outlet 56 to the inside space (i.e., the space in which evaporated materials 25 can move toward substrate 2) of bell-jar 30.

With reference to a concrete example of discharger 37, gas introduction tube 43 consists of an insulating material such as a quartz-made tube or a Pyrex-glass-made tube having the inner diameter of 2 to 10 cm. Discharge electrode 45 is made in the form of a metal antenna wound round the tube 43. For example, electrode 45 consists of a stainless pipe which is made a spiral shaped coil having the inner diameter of 5 cm to 20 cm. In this case, it is possible to cool the electrode by cooling water flowing inside the pipe. Electrode 45 is connected to lead-in terminal 48 to which a matching circuit (not shown) is connected outside the bell-jar. The other end of electrode 45 is free, i.e., unattached.

Protective member 44 and ring plate 46 cover the introduction tube 43 and electrode 45. They not only prevent tube 43, electrode 45 and terminal 48 from being polluted; but also prevent any high frequency power from leaking so as to stabilize the discharge. They are made of a metal plate such as a stainless steel plate.

Introduction tube 50 is made of a stainless steel pipe or a Teflon pipe. Reactive gases to be introduced through this pipe may be selectively used in the form of mixture gases of an inert gas such as argon gas and at least one kind of gas such as oxygen, nitrogen, hydrogen, methane, propane, silane, phosphine, diborane, arsine and the like, depending on the kinds of layers to be deposited.

Included as an example of the evaporation materials (i.e., 25 in FIG. 2), is at least one kind of material selected from a group consisting of tungsten, molybdenum, chrome, iridium, tantalum, titanium, nickel, indium-tin, aluminium, silicon, the oxides thereof, the nitrides thereof and the like. More specifically, it is possible to use the following materials as an evaporation material: indium-tin and/or the oxides thereof (in which a mixture gas of oxygen and Ar are introduced) for making an ITO layer; silicon or aluminium and/or the nitrides thereof (in which $N_2$ gas in introduced) for making a nitride layer; and silicon (in which hydrogen gas is introduced) for making an amorphous silicon hydride (a-Si:H). When using the mixture of oxygen gas and argon gas as an introducing gas, for example, at the flow rates of 30 cc/min. for the former and 50 cc/min. for the latter, the vacuum degree in the evaporation space of bell-jar 30 is maintained within the range of the order of $10^{-5}$ to $10^{-4}$ Torr. Accordingly, a high frequency discharge for which the high frequency lead-in power is 0 W to 3 KW can be stably generated inside introduction tube 43. The interrelation between the vacuum degree of the evaporation space and that of introduction tube 43 may be freely adjusted by changing the flow rate of the gas introduced and that of the air exhausted, the area of gas releasing opening 56, and the like. It is desired that the area of gas releasing opening 56 be 5 to 30 $cm^2$, for example.

Evaporators provided with such a discharger 37 as mentioned above exhibit the following characteristic features (1) to (5) as compared with the conventional types of evaporators:

(i) Gas pressure in discharge region 57 can be kept higher than that in the evaporation space by arranging gas introduction tube 43 in the vicinity of gas inlet 36 and 40. Therefore, a stable high frequency discharge may be performed.

In addition to the above, ions produced inside introduction tube 43 may be introduced into bell-jar immediately from gas releasing outlet 56. Therefore, the volume introduced and the introduction efficiency may be made greater. Further, gas pressure in the evaporation space may be reduced to make the electric field acceleration of an evaporation material unnecessary. Therefore, the various materials for substrates to be deposited may be selected, and excellent deposited layers may be produced.

(2) Discharge electrode 45 is arranged around the outer peripheral surface of introduction tube 43. Therefore, gas may be efficiently ionized or activated in introduction tube 43 in which a gas is maintained at relatively high pressure without increasing the gas pressure in the evaporation space. In addition, the gas discharge region is limited to the inside of discharge tube 43 and is separated from electrode 45. Therefore, electrode 45 is free from being bombarded by ions. Namely, vaporization of the electrode materials caused by heat or ion bombardment is prevented and contamination of the evaporation space is also prevented.

(3) Protective members 44, 46 are provided to embrace both introduction tube 43 and electrode 45. Therefore, evaporation materials are prevented from being deposited onto tube 43, electrode 45 and terminal 48. At the same time, a discharge voltage leak can be effectively prevented, so that discharge may be stably performed.

(4) Different from the structures of conventional dischargers, the above-mentioned sealing member 55 does not come into contact with discharge region 57. Therefore, it is possible to prevent the influences from discharge on sealing member 55, for example, sealing deteriorations such as gas leakage caused from the break down or fatigue of sealing member 55.

(5) Discharger 37 can be fitted to the wall of bell-jar 30 by simple means and it is easily attached to and detached from the wall. In addition, it is set up inside protrusion tube 30a protruded toward the peripheral portion of the evaporation space. Therefore, evaporation is not disturbed.

Figure 7:
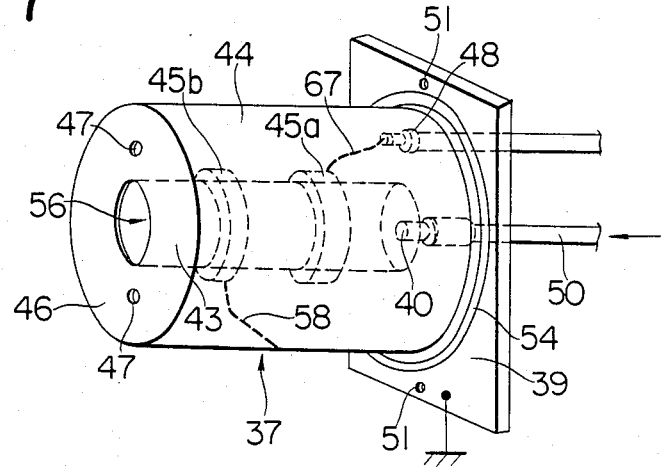
FIG. 7 is a perspective view of another type of discharger.

FIG. 7 illustrates a different discharger from that shown in FIG. 4. FIG. 7 shows another example of a discharger in which the discharge electrode thereof comprises a plurality of rings 45a, 45b so arranged as to embrace the outer circumferential surface of introduction tube 43. Electrode 45a is connected to high frequency lead-in terminal 48 by lead wire 67, while electrode 45b is connected to metal-made protective member 44 by lead wire 48 so as to be grounded through metal-made flange 39. Each of the above-mentioned electrodes 45a, 45b consists of a copper or stainless steel belt-shaped ring of 2 to 10 cm in inner diameter and 0.5 to 10 cm in width, and which generates a C-coupling type [i.e., a capacity-coupling type] discharge in introduction tube 43 (the belt-shaped ring can be cooled with a water cooling tube wound thereround.).

Figure 8:
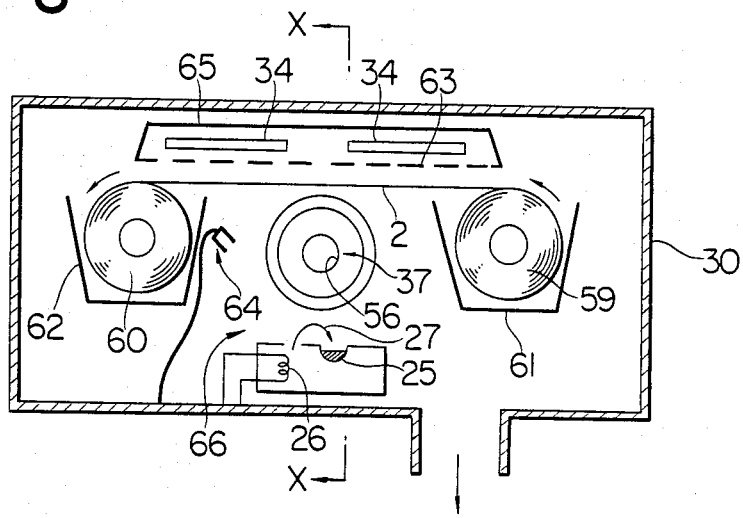
FIG. 8 is a schematic sectional view of another evaporator.
Figure 10:
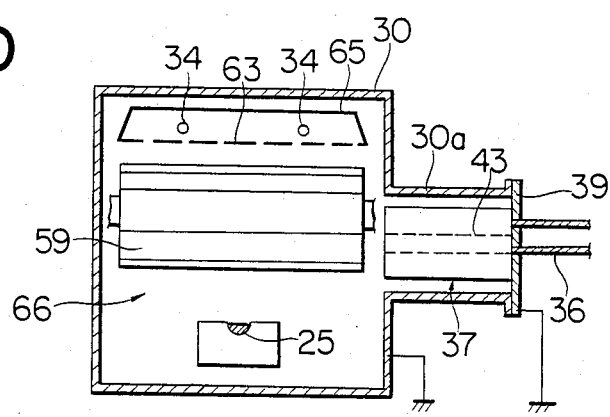
FIG. 10 is sectional view taken on line x—x of FIG. 8.

Reference now is made to FIGS. 8 and 10 which illustrate an example of an evaporator of the present invention, wherein like parts in each of the figures are identified by the same reference character and the descriptions thereof are sometimes omitted herefrom.

To a bell-jar 30 used as a vacuum chamber, discharger 37 is fitted as described above. Sheet 2 is arranged to face evaporation material 25 so as to serve as a substrate on which material is to be deposited. Sheet 2 is transported from supply roller 59 to take-up roller 50. Protective plates 61, 62 are provided to protects the rollers from deposition. Substrate 2 is evenly heated through metal wire net 63 by heater 34 (e.g., a halogen lamp heater). A heat reflection plate 65 is provided behind the wire net. Layer thickness monitor 64 (e.g., a well-known crystal monitor) is also provided so as to control the thickness of a deposited layer formed on substrate 2.

Figure 9:
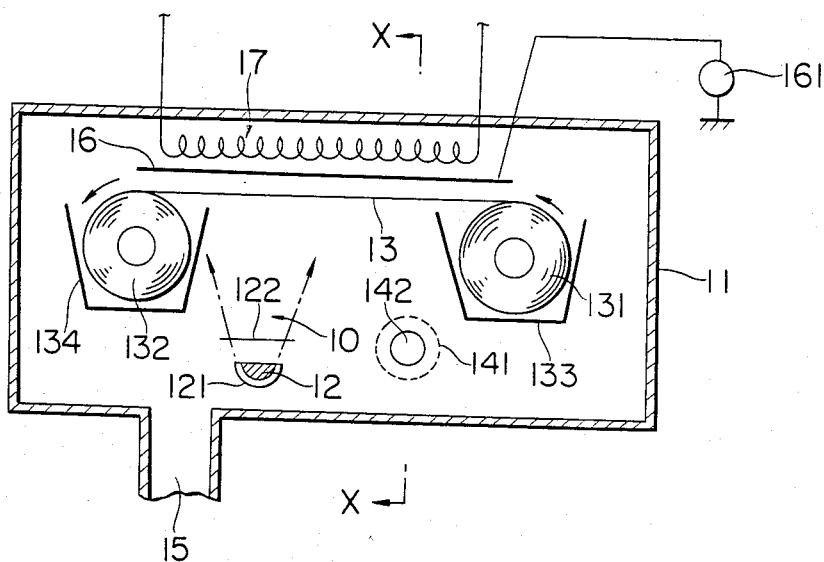
FIG. 9 is a schematic sectional view of a modification of the evaporator of FIG. 8.

FIG. 9, illustrates another example wherein, 11 is a bell-jar; 12 is a vapor source comprising a specific evaporation material; 121 is a port containing therein the vapor source 12; and 122 is a shutter covering the vapor source 12. Evaporated materials emitted from vapor source 12 are not suspended or strayed. It is therefore adequate to provide the shutter 122 so that the size thereof may cover the area made by the longitudinal side of evaporation space 10 which is an imaginary cube defined by port 121 and substrate 13 as the opposite sides of the cube.

Numeral 141 designates a discharger which is provided at a position on the side wall or on the floor of bell-jar 11, whichever is convenient for supplying the bell-jar 11 with reactive gas produced in the discharger. If gas release opening 142 for introducing gas from the discharger is directed toward evaporation space 10 between vapor source 12 and substrate 13, the film quality difference varies according to the gas distribution between the portion of the substrate near gas inlet 142 and the portion thereof far therefrom. Therefore, to ensure uniform film quality, it is better to position the gas inlet so that it is not directed toward the evaporation space 10 between the vapor source and the substrate, as shown in the drawings. By doing this, gas introduced from opening 142 is distributed uniformly into the bell-jar and is then reacted with the evaporated material present in evaporation space 10. Therefore, the reaction occurs uniformly and the quality of the film deposited on substrate 13 is uniform. Moreover, as shown in FIG. 9, discharger 141 is directed away from substrate 13.

The described evaporator may be operated under the following conditions:

Evaporation material: ITO tablet (Sn 5% by weight)
Evaporating method: Electron gun heating
Substrate to be deposited: Metal sheet or a resin sheet (e.g., polyethylene terephthalate sheet)
Temperature of Substrate: 70°–300° C.
Gas introduced: Mixture of oxygen gas (30 cc/min.) and argon gas (50 cc/min. with the purposes of stabilizing the amount of oxygen and adjusting the degree of oxidation taking place with oxygen.) Flow rates thereof are controllable, respectively.
High frequency discharger: That shown in FIG. 3 or FIG. 7 (High frequency power: 50 W–1 KW)

Under the above conditions, the mixture of oxygen gas and argon gas is discharge-ionized or activated. As the resulting gas is introduced into the evaporation space of the bell-jar, ITO tablet is heated by an electron gun and vaporized. The resulting vaporized ITO is reacted with the components of the introduced gas ions or the active gas and deposited on the substrate. Accordingly, when the vaporization speed of an evaporation material is set at the rate of 100–2000 Å/min. and the the transport speed of the substrate is set at 50–200 cm/min., the substrate can be formed with an ITO film thereon of sheet resistance at 500 $\Omega/cm^2$–1M$\Omega/cm^2$ and phototransmission at 80–90%.

Figure 12:
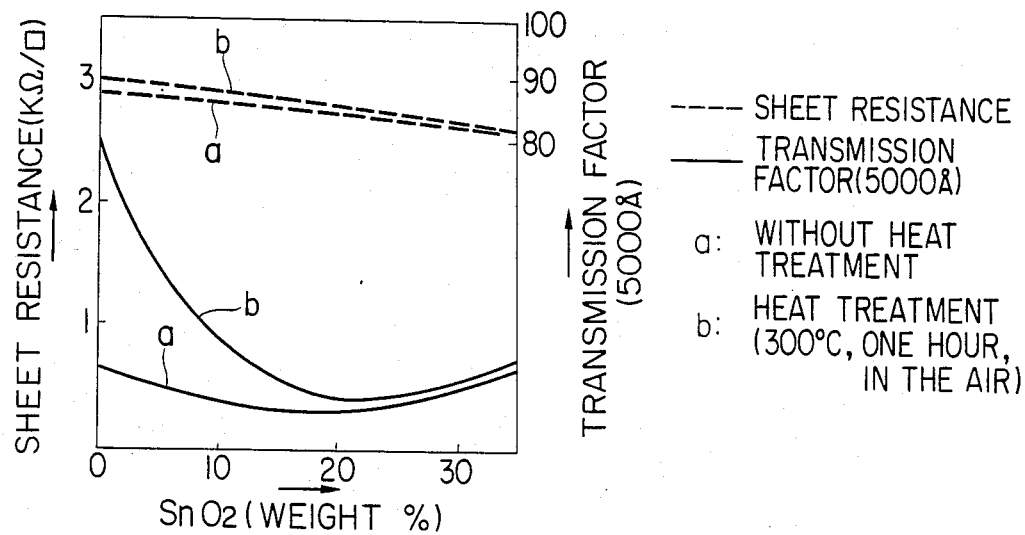
FIG. 12 is a graph indicating the characteristics of an ITO film obtained using an embodiment of the present invention.

The characteristics of an ITO film are also varied by changing the composition of an ITO tablet to be evaporated. FIG. 12 shows the variations of the sheet resistivity and the phototransmission of an ITO film deposited to a 400 Å thickness when the tin dioxide content was changed in an ITO tablet. The abscissas indicates the percentage by weight of the tin dioxide content and the ordinates indicate the sheet resistivity and the phototransmission. The results of durability tests obtained in a heat treatment at 300° C. for one hour in the air also are shown. The results are obvious in the figure. In particular the heat treatment causes the deterioration of the sheet resistivity to become serious when the tin dioxide content is not higher than five percent by weight. For example, the contents of a tin dioxide content of not less than three percent by weight will be suitable provided that the permissible deterioration permitted is limited by of a transparent electrode of a liquid crystal display unit of 1K$\Omega/\square$ as the standard. However, taking the other uses into consideration, the tin dioxide contents are 0.3 to 40% by weight and, more preferably 5 to 25% by weight. Further, the deposition speed of an ITO film is 100 to 2000 Å/min. and, more preferably, 200 to 1000 Å/min.

This invention is exemplified as described above, and it is however to be understood that any further variation and modification of the above embodiment may be made in the invention based upon the spirit and scope thereof.

Figure 11:
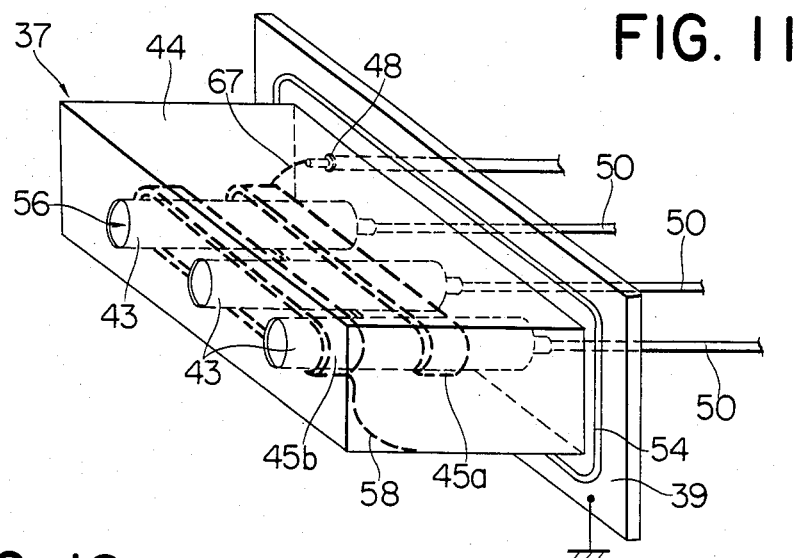
FIG. 11 is a perspective view of still another discharger.

For example, a plurality of the described gas introduction tubes 43 can be provided. As shown in FIG. 11, three separate introduction tubes 43 are juxtaposed to connect respectively with introduction tubes 50 and common belt-shaped electrodes 45a, 45b are wound therearound. This arrangement is advantageous, because the ionized or activated gas component can be distributed relatively more evenly on the surface of substrate 2. Gas distribution may be freely adjusted depending upon the arrangement of these gas introduction tubes. The number of discharge electrodes may not be less than two and the configuration thereof including the gas introduction tubes may also be in a square-shape or the like in addition to the globular-shape shown. The positions and the structures for fitting a discharger to a bell-jar may be variously modified. In addition, the discharger can be fitted to the bell-jar so as to protrude toward the inside of the evaporation space of the bell-jar. It is also possible to obtain desirable results when a gas release opening of the discharger is arranged so as to face the substrate, or when it is arranged in the neighborhood of the substrate of the vapor source.

Figure 13:
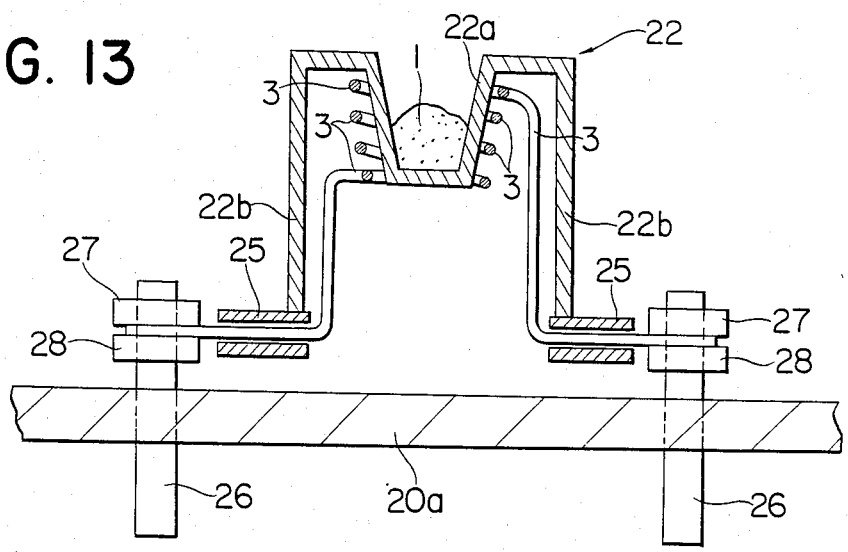
FIG. 13 is a vertical cross-sectional view of a port for vapor source.

FIG. 13 shows an example of a port for a vapor source suitable for the present invention.

Port 22 is a crucible (a pot) consisting of vessel 22a on which evaporation material 1 is placed, and cylindrical cover 22b surrounding resistance heating type heater 3 wound around vessel 22a. In addition, both ends of heater 3 are led out to the outside of heater cover 22b and are passed through pipe member 25 at least in the regions adjacent to heater cover 22b so as to be covered by the pipe. The ends of heater wire 3 led out from pipes 25 are inserted to a place between a pair of electrode plates 27, 28 arranged respectively in to leads 26 fixed through bottom wall 20a of the chamber, and the evaporator wires are then fixed mechanically thereto so as to be connected electrically to leads 26. Thereby, the port 22 is spatially fixed in the chamber so that it is supported by both leads 26. Further, an AC voltage (not shown) is applied between a pair of leads 26.

The materials of the port 22 may be variously selected, and inter alia the suitable ones are given below: the crucible consisting of vessel 22a and heater cover 22b may be made of at least one material selected from a group consisting of quartz, boron nitride, aluminum oxide, zirconium oxide, silicon carbide and the mixtures thereof. Those made of boron nitride are capable of being formed by planing down a block thereof, and those made of the other materials are capable of being formed in a sintering process (for aluminium oxide and SiC) or in a fusing process (for quartz). Next, pipe member 25 may be made of at least one material selected from a group consisting of quartz, boron nitride, aluminium oxide, zirconium oxide and silicon carbide. Further, heater wire 3 may be of the resistance heating type of at least one material selected from a group consisting of tungsten, molybdenum, tantalum and platinum, as same as the above-mentioned crucible.

Vapor source port 22 constructed as mentioned above has the following remarkable advantages which have not ever been displayed by any conventional one:

(1) Oxidation of a metal heater can remarkably be reduced, because heater wire 3 is located in the interval space of a crucible. In addition, this crucible is monolithic and is separated from heater 3 so that the materials thereof may not be peeled off or cracked and there may be no gap to leak the vapor of metal oxide of the heater. Accordingly, the vaporized metal oxide of the heater material can be prevented from mixing into the deposited layer or the evaporation material, and it is therefore possible to improve and stabilize the characteristics of the layer.

(2) In addition, the outgoing end of the heater that is apt to be oxidized by the heat of the crucible can be prevented from being oxidized, the vaporization of the metal oxide of the heater can also be stopped, and the deterioration of film performance caused by the contamination of the deposited layer can further be prevented, because the outgoing end of the heater led from the crucible is covered with cover member 25.

(3) The heat generated from the heater is prevented from leaking to the exterior, because heater 3 is surrounded by the vessel 22a heater cover 22b. It is thereby possible to evenly heat the evaporation material, and the loss of energy caused by heat radiation can also be reduced.

(4) The crucible is easily manufactured and assembled and the structure thereof can also be simplified, because the structure can serve as not only the cover for heater 3 but also the vessel for evaporation materials.

Now, referring to the concrete example of the invention, uniformly mixed and pressure-formed ITO tablet, as an evaporation material, containing 10% by weight of tin oxide was put in the port for a vapor source, and was then sublimated by electron beam irradiation from an electron gun. The evaporated material was thus deposited on a substrate made of a polyethylene phthalate film by applying a DC voltage of $-1$ KV to a rear electrode or by grounding the rear electrode. The polyethylene phthalate film was kept at a temperature of 25° to 30° C. The discharger shown in FIG. 4 was used. A high frequency discharge was performed at 13.56 MHz and 300 W. An ITO film of 400 Å in the thickness was thus prepared under the conditions of a vacuum pressure of $8 \times 10^{-4}$ Torr, and an evaporating speed of 120 Å/min. The transmission rate and sheet resistivity of the ITO film obtained were 84% and 600Ω/□, respectively, at a wavelength of 5000 Å. The discharger was disposed to the side wall of a bell-jar as shown in FIG. 9. The gas releasing tube was disposed so as not to direct the activated gas toward the space between the vapor source and the substrate.

We claim:

1. An evaporator for performing deposition on a substrate in a vacuum into which a reactive gas is introduced, the evaporator comprising:
   a vacuum tight containment means having an outwardly protruding portion;
   a vapor source disposed inside said containment means;
   an evaporation space between the substrate and said vapor source;
   a discharger disposed inside said outwardly protruding portion of said containment means and thereby isolated from said evaporation space, said discharger being directed away from the substrate and away from said evaporation space, said discharger comprising a gas introduction tube and a discharge electrode surrounding said gas introduction tube; and
   a protective member covering said gas introduction tube and said discharge electrode.

2. The evaporator of claim 1, wherein said vapor source includes a vessel surrounded by a resistance type heater coil and a cover surrounding said coil and shielding said coil from the reactive gas, said cover also having two pipe portions at the base of said cover, each said pipe portion extending to one of two pairs of electrode plates, each said pair of electrode plates being fixed to a respective electrode lead, each said lead extending through a wall of said containment means, each end of said coil extending through one of said pipes and being held between one of said pairs of electrode plates.

3. The evaporator of claim 1, further comprising a flange having a ring-shaped groove in the inner surface thereof and a sealing member in the attachment portion of said flange, said sealing member being fitted in said groove, said flange having an inner surface fixedly joined to said protruding portion to form an airtight seal, and said sealing member not contacting a discharge region of the evaporator.

4. The evaporator of claim 3, wherein said discharger is detachably attached to said containment means and said sealing member comprises an O-ring.

5. The evaporator of claim 1, wherein the gas introduction tube consists of an insulating material.

6. The evaporator of claim 3, wherein the gas introduction tube consists of an insulating material.

7. The evaporator of claim 4, wherein the gas introduction tube consists of an insulating material.

8. The evaporator of claim 1, wherein the discharger has two or more gas introduction tubes.

9. The evaporator of claim 2, wherein the discharger has two or more gas introduction tubes.

10. The evaporator of claim 3, wherein the discharger has two or more gas introduction tubes.

11. The evaporator of claim 4, wherein the discharger has two or more gas introduction tubes.

12. The evaporator of claim 5, wherein the discharger has two or more gas introduction tubes.

13. The evaporator of claim 6, wherein the discharger has two or more gas introduction tubes.

14. The evaporator of claim 1, wherein the peripheral surface of the introduction tube is wound round by a coil-shaped discharge electrode.

15. The evaporator of claim 2, wherein the peripheral surface of the introduction tube is wound round by a coil-shaped discharge electrode.

16. The evaporator of claim 3, wherein the peripheral surface of the introduction tube is wound round by a coil-shaped discharge electrode.

17. The evaporator of claim 4, wherein the peripheral surface of the introduction tube is wound round by a coil-shaped discharge electrode.

18. The evaporator of claim 5, wherein the peripheral surface of the introduction tube is wound round by a coil-shaped discharge electrode.

19. The evaporator of claim 6, wherein the peripheral surface of the introduction tube is wound round by a coil-shaped discharge electrode.

20. The evaporator of claim 7, wherein the peripheral surface of the introduction tube is wound round by a coil-shaped discharge electrode.

21. The evaporator of claim 8, wherein the peripheral surface of each said introduction tube is wound round by a coil-shaped discharge electrode.

22. The evaporator of claim 10, wherein the peripheral surface of each said introduction tube is wound round by a coil-shaped discharge electrode.

23. The evaporator of claim 11, wherein the peripheral surface of the introduction tube is wound round by a coil-shaped discharge electrode.

24. The evaporator of claim 13, wherein the peripheral surface of each said introduction tube is wound round by a coil-shaped discharge electrode.

* * * * *